(12) United States Patent
Smets et al.

(10) Patent No.: US 9,070,720 B2
(45) Date of Patent: Jun. 30, 2015

(54) TUNNEL FIELD EFFECT TRANSISTOR DEVICE AND METHOD FOR MAKING THE DEVICE

(71) Applicants: IMEC, Leuven (BE); Katholieke Universiteit, K.U. Leuven R&D, Leuven (BE)

(72) Inventors: Quentin Smets, Schaarbeek (BE); Anne S. Verhulst, Houtvenne (BE); Rita Rooyackers, Kessel-lo (BE); Marc Heyns, Linden (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 44 days.

(21) Appl. No.: 13/904,303

(22) Filed: May 29, 2013

(65) Prior Publication Data

US 2013/0334500 A1 Dec. 19, 2013

(30) Foreign Application Priority Data

Jun. 15, 2012 (EP) .................................... 12172186

(51) Int. Cl.
  *H01L 29/06* (2006.01)
  *H01L 29/08* (2006.01)
  *H01L 29/66* (2006.01)
  *H01L 29/739* (2006.01)
(52) U.S. Cl.
  CPC ...... *H01L 29/66977* (2013.01); *H01L 29/7391* (2013.01); *H01L 29/66477* (2013.01)

(58) Field of Classification Search
  CPC ................... H01L 29/66977; H01L 29/66477; H01L 29/7391
  USPC .............................................. 257/39; 438/197
  See application file for complete search history.

(56) References Cited

U.S. PATENT DOCUMENTS

| 5,589,696 A | * | 12/1996 | Baba .............................. 257/105 |
| 2004/0212009 A1 | * | 10/2004 | Wang et al. .................... 257/317 |
| 2007/0235801 A1 | * | 10/2007 | Cheng et al. ................... 257/330 |
| 2008/0246086 A1 | * | 10/2008 | Korec et al. .................... 257/343 |
| 2009/0014785 A1 | * | 1/2009 | Moens et al. .................. 257/330 |
| 2013/0093001 A1 | * | 4/2013 | Bhalla et al. ................... 257/329 |

OTHER PUBLICATIONS

Mohata et al., "Experimental Staggered-Source and N+ Pocket-Doped Channel III-V Tunnel Field-Effect Transistors and Their Scalabilities", Applied Physics Express 4 (Feb. 9, 2011), pp. 024105-1.
Vandooren et al., "Electrical Results of Vertical Si N-Tunnel FETs", 2011 Proceedings of the European Solid-State Device Research Conference (ESSDERC), Sep. 12, 2011, pp. 255-258.

(Continued)

*Primary Examiner* — Victor A Mandala
(74) *Attorney, Agent, or Firm* — Knobbe Martens Olson & Bear, LLP

(57) ABSTRACT

A Tunnel Field Effect Transistor device (TFET) made of at least following layers: a highly doped drain layer, a highly doped source layer, a channel layer, a gate dielectric layer and a gate electrode layer, the gate dielectric layer extending along the source layer, and a highly doped pocket layer extending in between and along the gate dielectric layer and the source layer, characterized in that the pocket layer extends to between and along the source layer and the channel layer.

24 Claims, 6 Drawing Sheets

(56) References Cited

OTHER PUBLICATIONS

Sterkel et al., "Characteristics and Optimization of Vertical and Planar Tunnelling-FETs", Journal of Physics: Conference Series, Institute of Physics Publishing, Bristol, GB, vol. 10, No. 1, Jan. 1, 2005, pp. 15-18.

Hansch et al., "Performance Improvement in Vertical Surface Tunneling Transistors by a Boron Surface Phase", Japanese Journal of Applied Physics, the Japan Society of Applied Physics, Tokyo, JP, vol. 40, No. 5A, Part 01, May 1, 2001, pp. 3131-3136.

Sun et al., "Comparative Study on Top- and Bottom-Source Vertical-Channel Tunnel Field-Effect Transistors", Ieice Transactions on Electronics, Institute of Electronics, Tokyo, JP, vol. E95C, No. 5, May 1, 2012, pp. 826-830.

Hu et al. "Green Transistor—A VDD Scaling Path for Future Low Power ICS", International Symposium on VLSI Technology, Systems and Applications, 2008, VLSI-TSA 2008, IEEE, Piscataway, NJ, USA, Apr. 21, 2008, pp. 14-15.

* cited by examiner

TUNNEL FIELD EFFECT TRANSISTOR DEVICE AND METHOD FOR MAKING THE DEVICE

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of EP 12172186.4 filed Jun. 15, 2012, the disclosure of which is hereby expressly incorporated by reference in its entirety and is hereby expressly made a portion of this application.

FIELD OF THE INVENTION

The disclosure relates to a tunnel field effect transistor device (TFET), and a method for making the device.

BACKGROUND OF THE INVENTION

TFET devices are already known to the person skilled in the art. U.S. Pat. No. 5,589,696 for example describes a Tunnel Field Effect Transistor device (TFET) made of at least following layers: a highly n-doped drain layer made of a drain semiconductor material, a highly p-doped, and thus oppositely doped with respect to the drain layer, source layer made of a source semiconductor material and a gate structure comprising a gate dielectric layer and a gate electrode layer.

The gate dielectric layer extends along the source layer while the gate electrode layer extends along the gate dielectric layer along a face of the gate dielectric layer opposing the face of the gate dielectric layer facing the source layer. The gate electrode layer does not extend beyond the gate dielectric layer. The device further comprises a highly counterdoped layer, with respect to the source layer, and thus n-doped pocket layer extending in between and along the gate dielectric layer and the source layer.

However, such a TFET does not allow efficiently controlling with the gate the flow of charge carriers through the substrate from the source to the counterdoped layer, such that charge carriers can still tunnel from the source to the part of the n-doped pocket layer which is not covered by the gate electrode resulting in a worse subthreshold swing due to an unwanted tail to the input characteristics. Another disadvantage of such a TFET is that it cannot be manufactured without at least an epitaxial regrowth (meaning an epitaxial growth which is not preceded immediately by another epitaxial growth) (causing a high amount of traps and thus off-state leakage current) or implantation (junctions which are not sharply defined).

In "Green transistor—A VDD Scaling Path for Future Low Power ICs" presented in the 2008 International Symposium on VLSI Technology, Systems, and Applications (VLSI-TSA), Hu et al. proposed a similar concept for a TFET, comprising of at least the following layers: a highly p-doped drain layer made of a drain semiconductor material, a highly n-doped source layer made of a source semiconductor material, a gate structure comprising a gate dielectric layer and a gate electrode layer, a pocket layer, counterdoped compared to the source layer, extending in between and along the source layer and the gate dielectric layer of the gate structure, a lowly doped channel layer made of a channel semiconductor material situated in between the source and the drain layer.

The gate dielectric layer extends along the pocket and channel layers while the gate electrode layer extends along the pocket layer and the channel layer along the gate dielectric layer adjacent to a face of the gate dielectric layer opposing the face of the gate dielectric layer facing the pocket and channel layers. The gate electrode layer does not extend beyond the gate dielectric layer.

However, such a TFET does not allow tight control of the relative location and doping of the source and pocket layers during fabrication of the TFET, important for the operation of the device since the device is relatively sensitive to absolute and relative doping levels and position of pockets. Another disadvantage of such a TFET is that it cannot be manufactured without at least an epitaxial regrowth (causing a high amount of traps and thus off-state leakage current) or implantation (junctions which are not sharply defined).

SUMMARY OF THE INVENTION

Therefore, it is an aim of the current disclosure to provide an improved TFET device.

This is achieved according to the TFET device of the current disclosure by providing a pocket layer extending to between and along the source layer and the channel layer.

In such a configuration, an active region is defined in the assembly of the pocket layer and the source layer where the gate dielectric layer and the gate electrode layer are positioned along the source layer and the pocket layer. In the active region, the desired tunneling current is generated: after charge carriers have tunneled into the active region from the source layer towards the pocket layer, they are drained away through a gate-induced low-potential-barrier transmission layer in the channel layer near the gate structure, and to the drain layer.

It has been found that such a configuration allows for improved suppression of the flow of charge carriers from the source layer to the drain layer in the region outside of the active region, which is the region which is, usually, not gate-controlled.

It has been further found that with such devices an improved operation becomes possible with a sudden increase in tunneling current and a steep subthreshold slope.

Moreover, as the active region extends along where the gate structure and the pocket layer and the source layer are positioned along each other, a relatively wide area is obtained for the charge carriers to tunnel towards the source layer, increasing the possible tunneling current.

Also, the presence of the pocket layer has been found to decrease the onset voltage applied to the gate for tunneling to occur towards the active region and has been found to decrease the amount of field induced quantum confinement. Therefore, unwanted tunneling of charge carriers from the source layer directly into the channel can be for example, especially in the presence of a leakage stop layer as explained below, avoided as the desired tunneling into the active region already starts at a lower voltage than the voltage needed for unwanted tunneling of charge carriers from the source layer directly into the channel.

Also, it was found that the processing procedure to provide such a pocket layer, which is based on a selective etch, results in a high quality of the pocket surface, onto which the gate dielectric is deposited, meaning that it is, for example, less rough and has a lower defect density, which is important for the operation of the device. This will be elaborated further below.

According to certain embodiments, at least part of the gate electrode layer and the gate dielectric layer extend along at least part of the channel layer.

According to certain embodiments of the current disclosure, the at least part of the gate dielectric layer extending along the at least part of the channel layer is in contact with the channel layer.

According to certain embodiments of the current disclosure, the gate electrode layer does not substantially extend along the drain layer and/or along the drain contact electrode, if present, such as to further avoid unwanted band-to-band tunneling in the drain layer or near the drain-channel junction, as well as to keep a relatively small gate-drain capacitance.

According to certain embodiments of the current disclosure, the source, pocket, channel and drain layers are substantially planar and positioned on top and along each other.

However according to other certain embodiments the TFET has a 3 dimensional Fin-FET like architecture (Fin-TFET) and the fin-like structure forms the source layer or the TFET is a vertical nanostructure (nanowire) and a nanowire forms the source layer.

According to preferred embodiments of the current disclosure, the pocket layer is an etch stop layer relative to the channel and drain layers. It has been found that such an etch stop layer allows for an improved method for making the TFET according to the current disclosure, leading to, for example, a decreased pocket surface roughness, improved pocket thickness control and more uniform onset of tunneling in the active area.

According to preferred embodiments of the current disclosure, the drain layer is in electrical contact with a drain contact electrode and/or the source in electrical contact with a source contact electrode and/or the gate electrode is in electrical contact with a gate contact electrode.

The disclosure also relates to a method of making the TFET according to the disclosure.

According to preferred embodiments of the current disclosure, a layer stack comprising the source layer, the pocket layer, the channel layer and the drain layer is provided, after which part of the drain layer and the channel layer is removed up to the pocket layer, after which the gate dielectric layer is applied to the exposed surface of the layer stack, after which the gate electrode layer is applied to the gate dielectric layer.

It has been found that with such a method of making the TFET according to the embodiments herein, the relative location and doping of the source and pocket layer can be better controlled, which is important for the operation of the device. It was also noted that epitaxial regrowth or implantation steps can be avoided such as to avoid the occurrence of trap assisted tunneling or junctions which are not suitably delimited.

According to preferred embodiments of the current disclosure, the gate electrode layer does not substantially extend along the drain layer and/or along the drain contact electrode, if present, such as to further avoid unwanted band-to-band tunneling in the drain layer or near the drain-channel junction, as well as to keep a relatively small gate-drain capacitance.

According to preferred embodiments of the current disclosure, the part of the drain layer and the channel layer is removed up to the pocket layer at least partly by etching up to an etch stop layer, preferably by a wet or dry selective etching technique. The etch stop layer for example is present in between and along the channel layer and the pocket layer or the pocket layer is the etch stop layer. Preferably the material of the etch stop layer is different from the materials in the layers around it, such as to allow for a selective removal process.

According to preferred embodiments of the current disclosure, the etch stop layer is the pocket layer. In such a configuration, a single step can suffice for selectively removing the part of the drain layer and the channel layer up to the pocket layer. Such a method allows to obtain an improved surface quality of the pocket layer which is less rough and has a lower defect density avoiding so-called trap assisted tunneling (TAT) where charge carriers tunnel from the source layer into the active region via traps, which has been found to degrade the subthreshold slope.

According to alternative embodiments of the current disclosure, the etch stop layer is different from the pocket layer and is removed after etching away the part of the drain layer and the channel layer up to the etch stop layer, for example by a selective removal method. Such a method allows to obtain an improved surface quality of the pocket layer avoiding so-called trap assisted tunneling (TAT) where charge carriers tunnel from the source layer into the active region via traps which in turn degrades the subthreshold slope. In such configuration, the etch stop layer preferably also functions as a leakage stop layer to prevent current flowing from source to drain through the bulk of the layer stack. In such case the etch stop layer preferably is made of a semiconductor material with a doping level of for example $10^{16}$ cm$^{-3}$ or higher such as for example between $10^{16}$ cm$^{-3}$ and $5.10^{20}$ cm$^{-3}$, preferably between $10^{17}$ cm$^{-3}$ and $10^{20}$ cm$^{-3}$. The etch stop layer preferably is of the same doping type (n type or p type) as the source layer.

According to preferred embodiments of the current disclosure, especially in embodiments where the etch stop layer, if present, is the pocket layer, a leakage stop layer is provided in between the pocket layer and the channel layer to prevent current flowing from source to drain through the bulk of the layer stack. This leakage stop layer is preferably selectively removed partly more preferably during the selective removal of part of the drain and channel layer. Preferably, the gate dielectric and the gate electrode run along at least part of the leakage stop layer. The leakage-stop layer preferably is made of a semiconductor material with a doping level of for example $10^{16}$ cm$^{-3}$ or higher such as for example between $10^{16}$ cm$^{-3}$ and $5.10^{20}$ cm$^{-3}$, preferably between $10^{17}$ cm$^{-3}$ and $10^{20}$ cm$^{-3}$. Preferably, the leakage stop layer is of the same doping type (n type or p type) as the source layer.

According to preferred embodiments of the method according to the current disclosure, the drain contact electrode is provided on top of the drain layer. In such configurations, the drain contact electrode can for example be used as a mask for the etching process, for example for the wet etching. In such a configuration, the drain contact electrode will for example be underetched. It has been found that due to the sudden change in topography at the drain contact electrode and the drain layer, the gate electrode layer can be interrupted at that location, preventing short circuiting the gate layer and the drain layer. The gate dielectric layer, although not critical for the disclosure can remain uninterrupted at the drain contact electrode and the drain layer.

BRIEF DESCRIPTION OF THE DRAWINGS

The disclosure will be further elucidated by means of the following description and the appended figures.

DETAILED DESCRIPTION OF THE PREFERRED EMBODIMENTS

Figure 1:
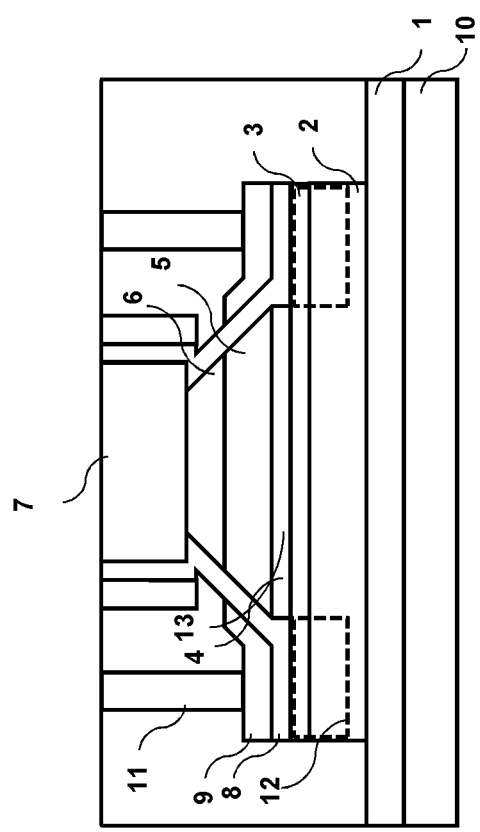
FIG. 1 shows a cross section of an embodiment of a tunnel field effect transistor (TFET) according to the present disclosure.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

FIG. 1 shows a cross section of an embodiment of a tunnel field effect transistor (TFET) according to the present disclosure.

More precisely FIG. 1 shows a Tunnel Field Effect Transistor device (TFET) made of at least following layers: a highly doped drain layer 6 made of a drain semiconductor material, e.g. with a doping level of $10^{16}$ cm$^{-3}$ or higher such as for example between $10^{16}$ cm$^{-3}$ and $5.10^{20}$ cm$^{-3}$, preferably between $10^{17}$ cm$^{-3}$ and $10^{20}$ cm$^{-3}$; a highly doped source layer 2, oppositely doped with respect to the drain layer, made of a source semiconductor material e.g. with a doping level of $10^{16}$ cm$^{-3}$ or higher such as for example between $10^{16}$ cm$^{-3}$ and $5.10^{20}$ cm$^{-3}$, preferably between $5.10^{18}$ cm$^{-3}$ and $10^{20}$ cm$^{-3}$; a channel layer 5 made of a lowly doped, e.g. doped at a doping level below $10^{18}$ cm$^{-3}$, for example between 0 cm$^{-3}$ and $10^{18}$ cm$^{-3}$, preferably between $10^{15}$ cm$^{-3}$ and $10^{17}$ cm$^{-3}$, or undoped channel semiconductor material. The channel layer 5 is situated in between the source 2 and the drain layer 6; a gate structure 8, 9 comprising a gate dielectric layer 8 and a gate electrode layer 9. The gate dielectric layer 8 extends along the source layer 2 and the gate electrode layer 9 extends along the gate dielectric layer 8 along a face of the gate dielectric layer 8 opposing the face of the gate dielectric layer 8 facing the source layer 2. The gate electrode layer 9 does not extend beyond the gate dielectric layer 8. At least part of the gate electrode layer 9 and the gate dielectric layer 8 may extend along at least part of the channel layer 5; and a highly doped, pocket layer 3 extending in between and along the gate dielectric layer 8 and the source layer 2. The pocket layer is made of a semiconductor material with a doping level of for example $10^{16}$ cm$^{-3}$ or higher such as for example between $10^{16}$ cm$^{-3}$ and $5.10^{20}$ cm$^{-3}$, preferably between $10^{17}$ cm$^{-3}$ and $10^{20}$ cm$^{-3}$.

The source layer 2 can be either a p- or n-doped layer. The drain layer is counterdoped with respect to the source layer.

The channel layer 5, if doped at all, can be either a p- or an n-doped layer depending on the desired characteristics of the TFET.

The pocket layer 3 preferably but not necessarily is counterdoped with respect to the source layer 2.

It can be seen in FIG. 1 that the pocket layer 3 extends to between and along the source layer 2 and the channel layer 5.

For the different layers any type of semiconductor material can be chosen, for example materials selected from at least one of group IV materials such as Si, Ge, C or binary compounds thereof, or group III/V materials such as In, Ga, As, Sb, Al, P, B, N or binary, tertiary or quaternary compounds thereof or group II/VI materials such as Cd, Zn, S, Se, Te, 0 or binary, tertiary or quaternary compounds thereof, or carbon nanotubes, graphene, etc. Preferably the resulting heterostructure consists of materials having a similar lattice constant, such that the resulting heterostructure interface has a high quality, meaning a low defect density. Examples of such material combinations are InP/In$_{0.53}$Ga$_{0.47}$As (lattice matched), InAs/GaSb (small lattice mismatch of 0.6%), In$_{0.53}$Ga$_{0.47}$As/GaAs$_{0.5}$Sb$_{0.5}$ (lattice matched).

It can be seen that preferably the at least part of the gate dielectric layer 8 which extends along the at least part of the channel layer 5 is in contact with the channel layer 5.

It is further shown that the source 2, pocket 3, channel 5 and drain 6 layers are substantially planar and positioned on top and along each other although other alternative embodiments will be described below.

The active region 12 defined in the assembly of the pocket layer 3 and the source layer 2 as explained above is schematically being delimited by a dotted line for sake of clarity.

Further, FIG. 1 shows that preferably the drain layer 6 is in electrical contact with a drain contact electrode 7 and/or the source 2 is in electrical contact with a source contact electrode 10 and/or the gate electrode 9 is in electrical contact with a gate contact electrode 11.

FIG. 1 shows that the source layer 2 is preferably deposited on a substrate 1 and further shows that the source contact electrode 10 is applied on the opposing side of the substrate 10. This is however not critical for the disclosure and the source contact electrode 10 can also be applied directly to the source layer 2, for example even omitting the substrate layer 1 depending on for example the desired characteristics of the TFET.

Figure 2:
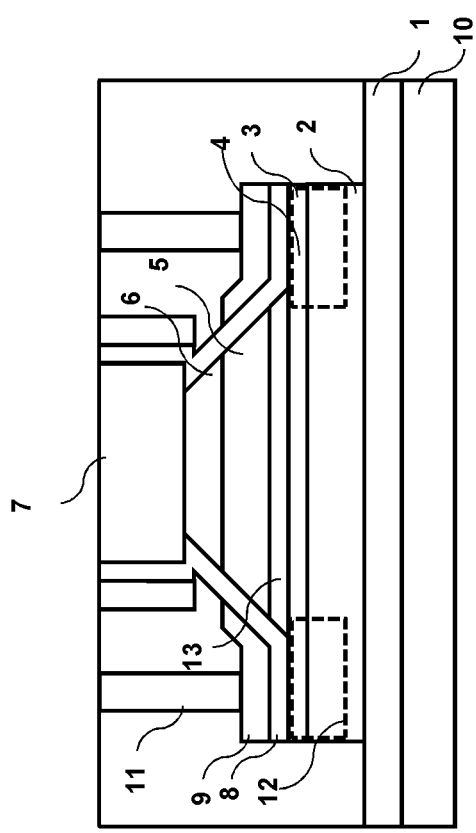
FIG. 2 shows a cross section of a different embodiment of a tunnel field effect transistor (TFET) according to the present disclosure.

In the embodiment shown in FIG. 1, an etch stop layer 4 is present in between and along the channel layer 5 and the pocket layer 3. FIG. 2 differs from FIG. 1 in that the pocket layer 3 is the etch-stop layer 4 and preferably a leakage stop layer 13 is added whereas in FIG. 1, the leakage-stop layer 13 is the etch-stop layer 4. The leakage stop layer 13, if present, is doped, preferably but not necessarily with a similar doping to the source layer 2. The leakage-stop layer is made of a semiconductor material with a doping level of for example $10^{16}$ cm$^{-3}$ or higher such as for example between $10^{16}$ cm$^{-3}$ and $5.10^{20}$ cm$^{-3}$, preferably between $10^{17}$ cm$^{-3}$ and $10^{20}$ cm$^{-3}$.

As can be seen in FIG. 1 and FIG. 2, preferably the channel 5 and drain 6 layer and if present, as shown in FIG. 1, for example the etch stop layer 4 which preferably also functions in this configuration as a leakage stop layer when separate from the pocket layer 3, and, as shown in FIG. 1, for example the leakage stop layer 13 when the pocket layer 3 is the etch stop layer 4, have delimiting edges which taper towards the drain contact electrode 7, for example as a consequence of the fabrication method, more in particular etching, more in particular wet etching, in the method for the TFET according to the disclosure. It is preferred that the delimiting edges are provided along faces having relatively closely packed atoms to further improve surface quality, for example the {111} face in for example InGaAs, more in particular In$_{0.53}$Ga$_{0.47}$As.

Figure 3:
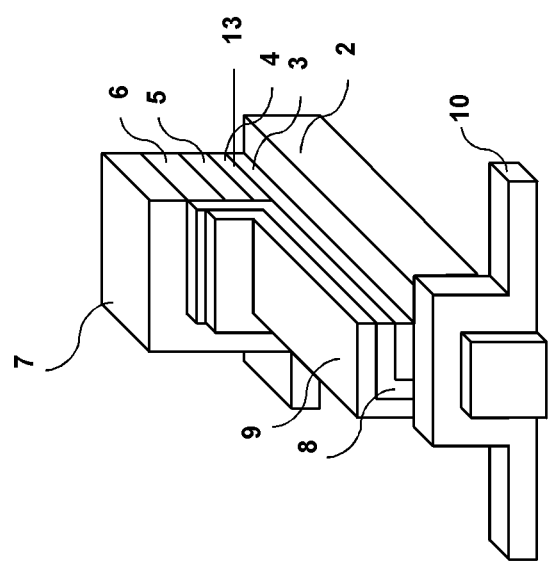
FIG. 3 shows an overview of another embodiment of a tunnel field effect transistor (TFET) according to the present disclosure.

FIG. 3 shows an alternative embodiment wherein the TFET has a 3 dimensional Fin-FET like architecture (Fin-TFET) and wherein the fin-like structure forms the source layer 2.

In the embodiment shown, the etch stop layer 4 preferably functions as a leakage-stop layer 13 and is separate from the pocket layer 3, although as explained above, the pocket layer 3 could also be the etch stop layer 4 in which case preferably, but not critically, a leakage stop layer 13 could be applied instead of the etch stop layer 4 shown in FIG. 3.

As can be further observed in FIG. 3, preferably the channel 5 and drain 6 layer and if present, for example the etch stop layer 4 when separate from the pocket layer 3 and, for example the leakage stop layer 13 when the pocket layer 3 is the etch stop layer 4, no longer have delimiting edges which taper towards the drain contact electrode 7.

Figure 4:
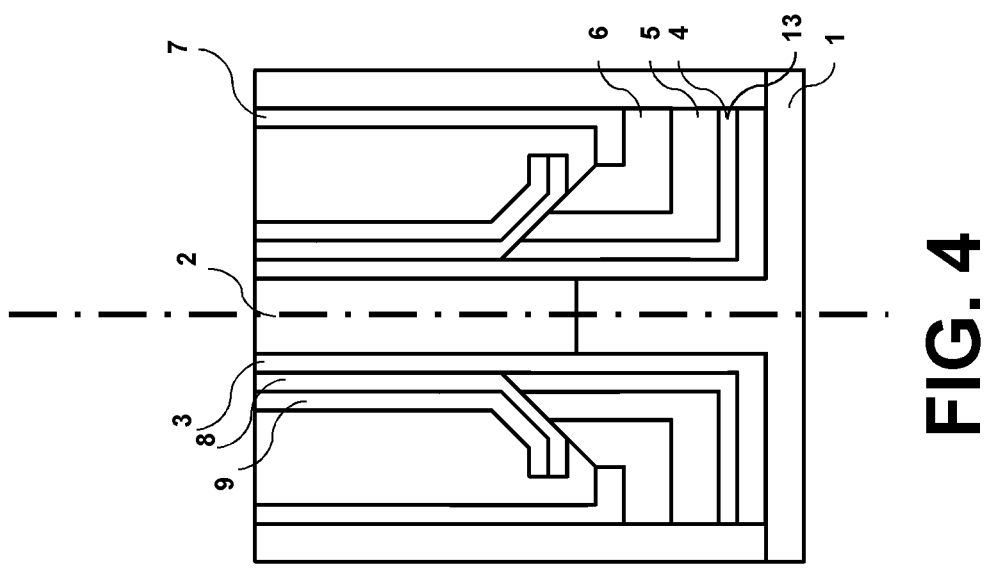
FIG. 4 shows a cross section of another embodiment of a tunnel field effect transistor (TFET) according to the present disclosure.

FIG. 4 shows TFET which is a vertical nanostructure (nanowire). The nanowire, as shown in FIG. 4, preferably is symmetrical with respect to an axis of symmetry through the source layer 2.

In the embodiments shown in FIG. 3 and FIG. 4, the etch stop layer 4 is separate from the pocket layer 3, although as explained above, the pocket layer 3 could also be the etch stop layer 4 in which case preferably, but not critically, a leakage stop layer 13 could be applied instead of the etch stop layer 4.

As can be further observed in FIG. 4, preferably the channel 5 and drain 6 layer and if present, for example the etch stop layer 4 when separate from the pocket layer 3 and, for example the leakage stop layer 13 when the pocket layer 3 is the etch stop layer 4, no longer have delimiting edges which taper towards the drain contact electrode 7.

FIGS. 5A-5F show an embodiment of the method according to the present disclosure for making the TFET shown in FIG. 1.

Figure 5A:
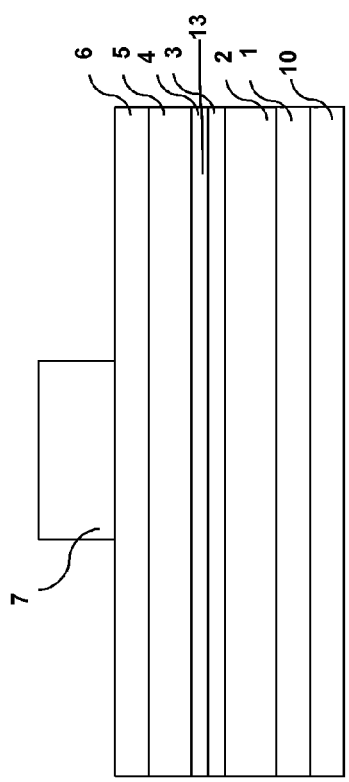
FIGS. 5A-5F show an embodiment of the method according to the present disclosure.
Figure 5B:
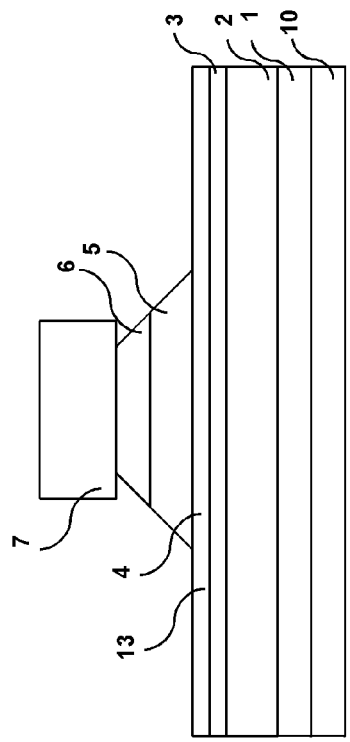

FIG. 5A shows a layer stack comprising the source layer 2, the pocket layer 3, the channel layer 5 and the drain layer 6. In the layer stack shown, the etch stop layer 4 and the pocket layer 3 are different from each other. Also, although not critical for the disclosure, a substrate layer and a source contact electrode 10 are provided. In addition the drain contact electrode 7 is shown and is provided on top of the drain layer 6.

Figure 5C:
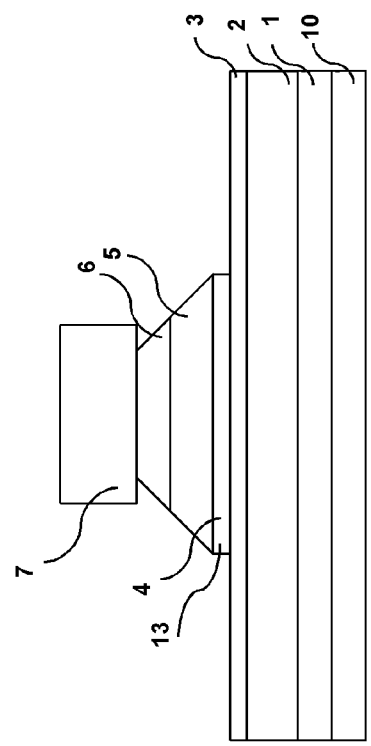

Subsequently, part of the drain layer 6 and the channel layer 5 is removed up to the pocket layer 3. This is for example shown in FIG. 5B and FIG. 5C and is for example done by dry or preferably wet etching. It can be seen that the material of the etch-stop layer 4, and preferably the material of the drain contact electrode 7, is chosen such as not to be etched away whereas the material of the drain layer 6 and the channel layer 5 is chosen such that they can be etched away. The tapering edges, as explained above, are the result of the etching technique used, in the case shown wet etching. In a subsequent step, for example as the etch stop layer 4 is still substantially covering the pocket layer 3, the etch stop layer 4 is also partly removed as shown in FIG. 5C, uncovering the pocket layer 3 for application of the gate structure 8, 9.

In case for example the etch stop layer 4 and the pocket layer 3 are the same no subsequent removal of the etch stop layer 4 is necessary. When in such situation a leakage stop layer 13 is provided in between the pocket layer 3 and the channel layer 5 to prevent current flowing from source layer 2 to drain layer 6 through the bulk of the layer stack, the material of the leakage stop layer 13 preferably is also selected such as to be etched away together with the channel layer 5 and the drain layer 6. Such an embodiment has however not been depicted in the figures.

Figure 5E:
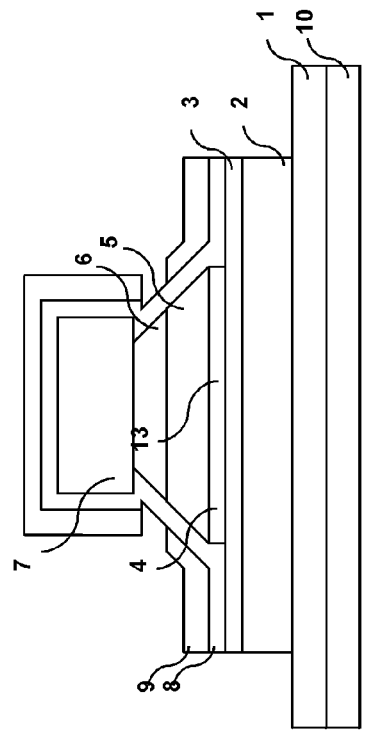
Figure 5D:
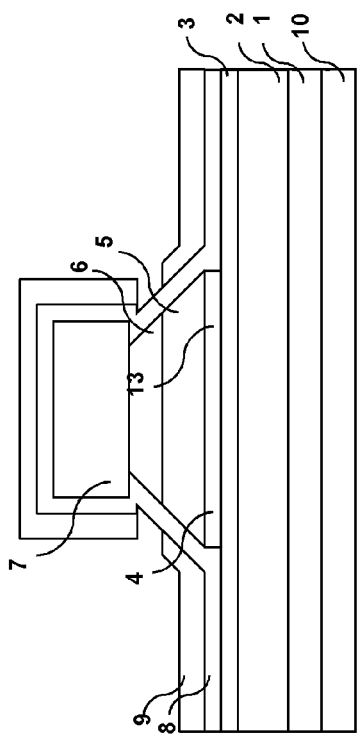
Figure 5F:
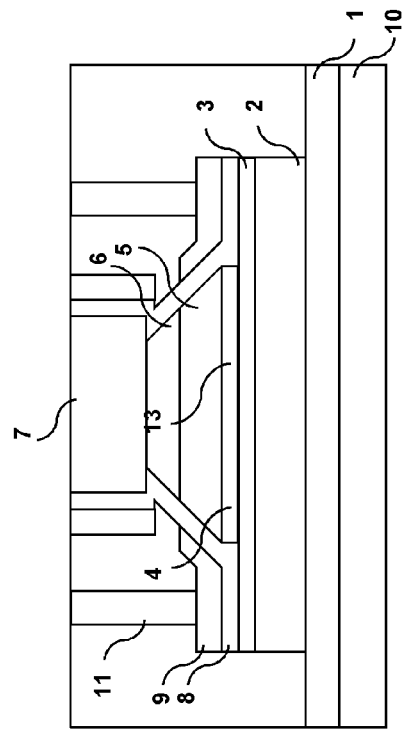

Further, FIG. 5D shows a further step of the method according to the disclosure, in which the gate dielectric layer 8 is applied to the exposed surface of the layer stack, after which the gate electrode layer 9 is applied to the gate dielectric layer 8. It can be observed that the drain contact electrode 7 has for example been underetched. Due to the sudden change in topography at the drain contact electrode 7 and the drain layer 6, the gate electrode layer 9 can be interrupted at that location, preventing short circuiting the gate electrode layer 9 and the drain layer 6. The gate dielectric layer 8, although not critical for the disclosure has remained uninterrupted at the drain contact electrode 9 and the drain layer 6.

FIG. 5E shows the preferred removal of part of the layer stack up to the substrate 1 and FIG. 5D shows the subsequent preferred covering of the layer stack obtained in FIG. 5E with a dielectric material for electrically isolating the TFET and the creation of the gate contact electrodes 11 for electrically contacting the gate electrode layer 9. Finally, the upper surface is at least partly removed up to the drain contact electrode 7 for contacting the drain contact electrode 7.

The above description presents the best mode contemplated for carrying out the present invention, and of the manner and process of making and using it, in such full, clear, concise, and exact terms as to enable any person skilled in the art to which it pertains to make and use this invention. This invention is, however, susceptible to modifications and alternate constructions from that discussed above that are fully equivalent. Consequently, this invention is not limited to the particular embodiments disclosed. On the contrary, this invention covers all modifications and alternate constructions coming within the spirit and scope of the invention as generally expressed by the following claims, which particularly point out and distinctly claim the subject matter of the invention. While the disclosure has been illustrated and described in detail in the drawings and foregoing description, such illustration and description are to be considered illustrative or exemplary and not restrictive.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article 'a' or 'an' does not exclude a plurality. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases 'at least one' and 'one or more' to introduce claim recitations. However, the use of such phrases should not be construed to imply that the introduction of a claim recitation by the indefinite articles 'a' or 'an' limits any particular claim containing such introduced claim recitation to embodiments containing only one such recitation, even when the same claim includes the introductory phrases 'one or more' or 'at least one' and indefinite articles such as 'a' or 'an' (e.g., 'a' and/or 'an' should typically be interpreted to mean 'at least one' or 'one or more'); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of 'two recitations,' without other modifiers, typically means at least two recitations, or two or more recitations). Furthermore, in those instances where a convention analogous to 'at least one of A, B, and C, etc.' is used, in general such a construction is intended in the sense one having skill in the art would understand the convention (e.g., 'a system having at least one of A, B, and C' would include but not be limited to systems that have A alone, B alone, C alone, A and B together, A and C together, B and C together, and/or A, B, and C together, etc.). In those instances where a convention analogous to 'at least one of A, B, or C, etc.' is used, in general such a construction is intended in the sense one having skill in the art would understand the convention (e.g., 'a system having at least one of A, B, or C' would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase 'A or B' will be understood to include the possibilities of 'A' or 'B' or 'A and B.'

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A tunnel field effect transistor device made of at least following layers:
   a highly doped drain layer made of a drain semiconductor material;

a highly doped source layer, oppositely doped with respect to the drain layer, made of a source semiconductor material;

a channel layer made of a lowly doped or undoped channel semiconductor material situated in between the source and the drain layer;

a gate structure comprising a gate dielectric layer and a gate electrode layer, the gate dielectric layer extending along the source layer and the gate electrode layer extending along the gate dielectric layer along a face of the gate dielectric layer opposing the face of the gate dielectric layer facing the source layer and not extending beyond the gate dielectric layer; and a highly doped, pocket layer extending in between and along the gate dielectric layer and the source layer, wherein the pocket layer extends between and along the source layer and the channel layer, and wherein the source layer, the pocket layer, the channel layer and the drain layer are substantially planar and positioned on top and along each other.

2. The tunnel field effect transistor of claim 1, wherein the pocket layer is counterdoped with respect to the source layer.

3. The tunnel field effect transistor of claim 1, wherein at least a part of the gate dielectric layer extends along at least a part of the channel layer and is in contact with the channel layer.

4. The tunnel field effect transistor of claim 1, wherein the drain layer is in electrical contact with a drain contact electrode and/or the source in electrical contact with a source contact electrode and/or the gate electrode is in electrical contact with a gate contact electrode.

5. The tunnel field effect transistor of claim 1, wherein the drain semiconductor material has a doping level of between $10^{16}$ cm$^{-3}$ and $5 \cdot 10^{20}$ cm$^{-3}$, wherein the source semiconductor material has a doping level of between $10^{16}$ cm$^{-3}$ and $5 \cdot 10^{20}$ cm$^{-3}$, wherein the lowly doped channel semiconductor material has a doping level of between $10^{15}$ cm$^{-3}$ and $10^{17}$ cm$^{-3}$, and wherein the semiconductor material of the pocket layer has a doping level of between $10^{16}$ cm$^{-3}$ and $5 \cdot 10^{20}$ cm$^{-3}$.

6. A method of making a tunnel field effect transistor, comprising, in sequence:

providing a layer stack comprising a source layer, a pocket layer, a channel layer and a drain layer;

removing a part of the drain layer and a part of the channel layer up to the pocket layer;

applying a gate dielectric layer to an exposed surface of the layer stack; and applying a gate electrode layer to the gate dielectric layer, whereby the tunnel field effect transistor of claim 4 is obtained.

7. The method of claim 6, wherein the part of the drain layer and the channel layer is removed up to the pocket layer by at least partly etching up to an etch stop layer.

8. The method of claim 7, wherein the etch stop layer is the pocket layer.

9. The method of claim 8, wherein a leakage stop layer is provided in between the pocket layer and the channel layer to prevent current flowing from source to drain through the bulk of the layer stack.

10. The method of claim 7, wherein an etch stop layer is present in between and along the channel layer and the pocket layer, and wherein the etch stop layer is different from the pocket layer and is removed after etching away the part of the drain layer and the channel layer.

11. The method of claim 6, wherein the drain contact electrode is provided on top of the drain layer.

12. A tunnel field effect transistor device made of at least following layers:

a highly doped drain layer made of a drain semiconductor material;

a highly doped source layer, oppositely doped with respect to the drain layer, made of a source semiconductor material;

a channel layer made of a lowly doped or undoped channel semiconductor material situated in between the source and the drain layer;

a gate structure comprising a gate dielectric layer and a gate electrode layer, the gate dielectric layer extending along the source layer and the gate electrode layer extending along the gate dielectric layer along a face of the gate dielectric layer opposing the face of the gate dielectric layer facing the source layer and not extending beyond the gate dielectric layer; and a highly doped, pocket layer extending in between and along the gate dielectric layer and the source layer, wherein the pocket layer extends between and along the source layer and the channel layer, wherein an etch stop layer is present in between and along the channel layer and the pocket layer.

13. The tunnel field effect transistor of claim 12, wherein the semiconductor material of the etch stop has a doping level of $10^{16}$ cm$^{-3}$ or higher.

14. The tunnel field effect transistor of claim 12, wherein the semiconductor material of the etch stop has a doping level of between $10^{16}$ cm$^{-3}$ and $5 \cdot 10^{20}$ cm$^{-3}$.

15. The tunnel field effect transistor of claim 12, wherein the semiconductor material of the etch stop has a doping level of between $10^{17}$ cm$^{-3}$ and $10^{20}$ cm$^{-3}$.

16. A tunnel field effect transistor device made of at least following layers:

a highly doped drain layer made of a drain semiconductor material;

a highly doped source layer, oppositely doped with respect to the drain layer, made of a source semiconductor material;

a channel layer made of a lowly doped or undoped channel semiconductor material situated in between the source and the drain layer;

a gate structure comprising a gate dielectric layer and a gate electrode layer, the gate dielectric layer extending along the source layer and the gate electrode layer extending along the gate dielectric layer along a face of the gate dielectric layer opposing the face of the gate dielectric layer facing the source layer and not extending beyond the gate dielectric layer; and a highly doped, pocket layer extending in between and along the gate dielectric layer and the source layer, wherein the pocket layer extends between and along the source layer and the channel layer, wherein a leakage stop layer is present in between and along the channel layer and the pocket layer.

17. The tunnel field effect transistor of claim 16, wherein the semiconductor material of the leakage stop layer has a doping level of $10^{16}$ cm$^{-3}$ or higher.

18. The tunnel field effect transistor of claim 16, wherein the semiconductor material of the leakage stop layer has a doping level of between $10^{16}$ cm$^{-3}$ and $5 \cdot 10^{20}$ cm$^{-3}$.

19. The tunnel field effect transistor of claim 16, wherein the semiconductor material of the leakage stop layer has a doping level of between $10^{17}$ cm$^{-3}$ and $10^{20}$ cm$^{-3}$.

20. A tunnel field effect transistor device made of at least following layers:
- a highly doped drain layer made of a drain semiconductor material;
- a highly doped source layer, oppositely doped with respect to the drain layer, made of a source semiconductor material;
- a channel layer made of a lowly doped or undoped channel semiconductor material situated in between the source and the drain layer;
- a gate structure comprising a gate dielectric layer and a gate electrode layer, the gate dielectric layer extending along the source layer and the gate electrode layer extending along the gate dielectric layer along a face of the gate dielectric layer opposing the face of the gate dielectric layer facing the source layer and not extending beyond the gate dielectric layer; and
- a highly doped, pocket layer extending in between and along the gate dielectric layer and the source layer, wherein the pocket layer extends between and along the source layer and the channel layer, wherein the drain semiconductor material has a doping level of $10^{16}$ cm$^{-3}$ or higher, wherein the source semiconductor material has a doping level of $10^{16}$ cm$^{-3}$ or higher, wherein the lowly doped channel semiconductor material has a doping level below $10^{18}$ cm$^{-3}$, and wherein the semiconductor material of the pocket layer has a doping level of for example $10^{16}$ cm$^{-3}$ or higher.

21. The tunnel field effect transistor of claim 20, having a structure with a three dimensional Fin-tunnel field effect transistor like architecture, wherein the structure comprises the source layer.

22. The tunnel field effect transistor of claim 20, wherein the tunnel field effect transistor is a vertical nanostructure or nanowire.

23. A tunnel field effect transistor device made of at least following layers:
- a highly doped drain layer made of a drain semiconductor material;
- a highly doped source layer, oppositely doped with respect to the drain layer, made of a source semiconductor material;
- a channel layer made of a lowly doped or undoped channel semiconductor material situated in between the source and the drain layer;
- a gate structure comprising a gate dielectric layer and a gate electrode layer, the gate dielectric layer extending along the source layer and the gate electrode layer extending along the gate dielectric layer along a face of the gate dielectric layer opposing the face of the gate dielectric layer facing the source layer and not extending beyond the gate dielectric layer; and
- a highly doped, pocket layer extending in between and along the gate dielectric layer and the source layer, wherein the pocket layer extends between and along the source layer and the channel layer, wherein the drain semiconductor material has a doping level of between $10^{17}$ cm$^{-3}$ and $10^{20}$ cm$^{-3}$, wherein the source semiconductor material has a doping level of between $5 \cdot 10^{18}$ cm$^{-3}$ and $10^{20}$ cm$^{-3}$, and wherein the semiconductor material of the pocket layer has a doping level of between $10^{17}$ cm$^{-3}$ and $10^{20}$ cm$^{-3}$.

24. A tunnel field effect transistor device made of at least following layers:
- a highly doped drain layer made of a drain semiconductor material;
- a highly doped source layer, oppositely doped with respect to the drain layer, made of a source semiconductor material;
- a channel layer made of a lowly doped or undoped channel semiconductor material situated in between the source and the drain layer;
- a gate structure comprising a gate dielectric layer and a gate electrode layer, the gate dielectric layer extending along the source layer and the gate electrode layer extending along the gate dielectric layer along a face of the gate dielectric layer opposing the face of the gate dielectric layer facing the source layer and not extending beyond the gate dielectric layer; and
- a highly doped, pocket layer extending in between and along the gate dielectric layer and the source layer, wherein the pocket layer extends between and along the source layer and the channel layer, wherein the channel semiconductor material is undoped channel semiconductor material.

* * * * *

UNITED STATES PATENT AND TRADEMARK OFFICE
CERTIFICATE OF CORRECTION

PATENT NO.         : 9,070,720 B2                                    Page 1 of 1
APPLICATION NO.    : 13/904303
DATED              : June 30, 2015
INVENTOR(S)        : Quentin Smets It is certified that error appears in the above-identified patent and that said Letters Patent is hereby corrected as shown below:

In The Claims
In column 11 at line 50, In Claim 6, change "claim 4" to --claim 1--.

Signed and Sealed this
First Day of March, 2016

Michelle K. Lee
*Director of the United States Patent and Trademark Office*